United States Patent
Kim et al.

(10) Patent No.: US 11,011,395 B2
(45) Date of Patent: May 18, 2021

(54) COVER STRUCTURE FOR A LIGHT SOURCE, LIGHT ILLUMINATING APPARATUS HAVING THE SAME

(71) Applicant: SAMSUNG ELECTRONICS CO., LTD., Suwon-si (KR)

(72) Inventors: Young-Sik Kim, Cheonan-si (KR); Young-Hong Han, Cheonan-si (KR); Sung-Bok Hong, Cheonan-si (KR); Young-Gon Hwang, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/202,344

(22) Filed: Nov. 28, 2018

(65) Prior Publication Data
US 2019/0311926 A1    Oct. 10, 2019

(30) Foreign Application Priority Data
Apr. 6, 2018   (KR) .................. 10-2018-0040443

(51) Int. Cl.
*B32B 43/00* (2006.01)
*H01L 21/67* (2006.01)

(52) U.S. Cl.
CPC .. *H01L 21/67132* (2013.01); *H01L 21/67017* (2013.01); *H01L 2221/68386* (2013.01); *Y10S 156/93* (2013.01); *Y10S 156/941* (2013.01); *Y10T 156/1158* (2015.01); *Y10T 156/1917* (2015.01)

(58) Field of Classification Search
CPC . H01L 2221/68381; H01L 2221/68386; Y10T 156/1158; Y10T 156/1917; Y10S 156/93; Y10S 156/941
See application file for complete search history.

(56) References Cited

U.S. PATENT DOCUMENTS

| | | | |
|---|---|---|---|
| 5,872,365 | A | 2/1999 | Goh et al. |
| 6,555,835 | B1 | 4/2003 | Wydeven |
| 6,564,421 | B2 | 5/2003 | Park et al. |
| 6,620,251 | B2 | 9/2003 | Kitano |
| 7,091,499 | B2 | 8/2006 | Okawa |
| 7,858,954 | B2 | 12/2010 | Kurita |
| 9,390,948 | B2 | 7/2016 | Taga et al. |
| 2006/0033054 | A1* | 2/2006 | Yamada ............. H01L 21/6835 250/504 R |
| 2008/0020549 | A1 | 1/2008 | Tsidilkovski et al. |

(Continued)

FOREIGN PATENT DOCUMENTS

KR    10-0327880    2/2002

*Primary Examiner* — Mark A Osele
(74) *Attorney, Agent, or Firm* — F. Chau & Associates, LLC

(57) ABSTRACT

A cover structure for a light source includes a frame having an inner space, a driver, and an oxygen discharger. The frame is combined with the light source such that an object disposed in the inner space is covered by the frame, and the inner space is sealed by the combined frame and light source to provide a closed space between the frame and the light source enclosing the object. The driver combines the frame and the light source by moving the frame toward the light source such that the frame contacts the light source. The oxygen discharger creates a low-oxygen state in the closed space by discharging oxygen from the closed space.

14 Claims, 9 Drawing Sheets

(56) References Cited

U.S. PATENT DOCUMENTS

| | | | |
|---|---|---|---|
| 2008/0101780 A1* | 5/2008 | Yokouchi | H01L 21/67109 392/416 |
| 2009/0095418 A1* | 4/2009 | Yamamoto | H01L 21/67132 156/712 |
| 2011/0017391 A1* | 1/2011 | Yamamoto | H01L 21/67132 156/249 |
| 2011/0318580 A1* | 12/2011 | Choi | C09J 171/00 428/355 EN |
| 2013/0078789 A1 | 3/2013 | Nakayama | |
| 2016/0151964 A1* | 6/2016 | Takenouchi | B29C 65/02 156/285 |
| 2019/0086808 A1* | 3/2019 | Nakayama | G03F 7/2002 |

\* cited by examiner

COVER STRUCTURE FOR A LIGHT SOURCE, LIGHT ILLUMINATING APPARATUS HAVING THE SAME

CROSS-REFERENCE TO RELATED APPLICATIONS

This application claims priority under 35 U.S.C § 119 to Korean Patent Application No. 10-2018-0040443 filed on Apr. 6, 2018 in the Korean Intellectual Property Office, the disclosure of which is incorporated by reference herein in its entirety.

TECHNICAL FIELD

Exemplary embodiments relate to a cover structure, a light illuminating apparatus having the same, and a method of bonding a die to a circuit board using the same. More particularly, exemplary embodiments relate to a cover structure of an ultraviolet light source for a semiconductor package, a light illuminating apparatus having the cover structure, and a method of bonding a die to a circuit board using the light illuminating apparatus.

DISCUSSION OF THE RELATED ART

When a plurality of semiconductor chips is manufactured on a wafer by a series of fabrication processes, the semiconductor chips are separated into dies by a sawing process. Each separated chip (or die) is provided into a chip-based package process such as a bonding process.

The die is typically transferred to the package process by a wafer. For example, when the sawing process of a wafer is completed and the chips are separated from each other at the wafer, an ultraviolet tape is attached to a rear portion of the wafer to attach the plurality of the chips to each other, and a wafer ring is combined with the wafer. The wafer ring encloses the wafer and tightens the wafer. Thus, the separated chips are held into a shape corresponding to the wafer, and a bulk of the separated chips or the dies is transferred to the package process while maintaining the shape of the wafer.

Thus, the wafer becomes a separated wafer in which the chips are individually separated by the sawing process and are bound to each other by the ultraviolet tape and the wafer ring. Then, the separated wafer is transferred to the packaging process by a transfer unit such as a wafer cassette.

In the packaging process, the dies are picked up individually and are put into the packaging process individually. Thus, the bounded chips or dies need to be separated into individual chips or dies. The separated wafer, which is taken out of the wafer cassette, is mounted on an ultraviolet light source, and ultraviolet light is emitted and illuminates the rear portion of the wafer to loosen the attachment between the separated chips and the ultraviolet tape. Then, the wafer ring is removed from the separated wafer, and each of the chips or the dies is individually picked up by a pickup assembly.

Each chip tends to be distorted at an edge portion in the sawing process, and a lifting space is usually found at the edge portion of each chip. The lifting space of each distorted chip is filled with air, and the oxygen (O2) in the lifting space of the chip typically obstructs or prevents the hardening of the ultraviolet tape by the ultraviolet light. That is, the attachment between the separated chips and the ultraviolet tape is not loosened, and the edge portion of the chip is still attached to the ultraviolet tape in spite of the ultraviolet tape being illuminated with the ultraviolet light. As a result, the separated chips are not sufficiently separated from the ultraviolet tape at the edge portions, and thus, the separated chips of the separated wafer are difficult to pick up individually despite the ultraviolet light illumination.

As the thickness of the chips decreases due to the back-grinding process, the edge distortion of the chips tends to increase in the sawing process. Accordingly, insufficient separation of the chips from the ultraviolet tape tends to occur more frequently due to the hardening failure of the ultraviolet tape caused by the oxygen in the lifting space.

In a case in which the chips are not sufficiently separated from the ultraviolet tape, more external force is typically required to pick up the chips from the separated wafer. As a result, the chips are frequently broken as a result of the additional external force when being picked up individually. In such a case, a defective die, which is a partially broken chip, is provided in the packaging process.

SUMMARY

Exemplary embodiments of the present inventive concept provide a cover structure which is selectively combined with an ultraviolet light source to create a sealed inner space in which an oxygen concentration can be controlled.

Exemplary embodiments of the present inventive concept provide an ultraviolet light source having the above-described cover structure.

Exemplary embodiments of the present inventive concept provide a method of boding a die to a substrate using the above-described ultraviolet light source.

According to exemplary embodiments of the inventive concept, a cover structure for a light source includes a frame having an inner space, a driver, and an oxygen discharger. The frame is combined with the light source such that an object disposed in the inner space is covered by the frame, and the inner space is sealed by the combined frame and light source to provide a closed space between the frame and the light source enclosing the object. The driver combines the frame and the light source by moving the frame toward the light source such that the frame contacts the light source. The oxygen discharger creates a low-oxygen state in the closed space by discharging oxygen from the closed space.

According to exemplary embodiments of the inventive concept, a light illuminating apparatus includes a body including a housing and a transparent support structure. The housing has a three-dimensional shape including an open top, and the transparent support structure covers a portion of the housing and supports a dicing substrate in which a plurality of separated chips is attached to one another by an adhesive. The light illuminating apparatus further includes a light source disposed in the body and emitting a light. The chips are detached from the adhesive in response to the emitted light illuminating the dicing substrate. The light illuminating apparatus further includes a cover structure combined with the body and covering the dicing substrate. The cover structure includes a frame including an inner space. The frame is combined with the body such that the dicing substrate is disposed in the inner space, and the inner space is sealed by the combined frame and body to provide a closed space between the frame and the body enclosing the dicing substrate. The cover structure further includes a driver that combines the frame and the body by moving the frame toward the body, and an oxygen discharger that creates a low-oxygen state in the closed space by discharging oxygen from the closed space.

According to exemplary embodiments of the inventive concept, a method of bonding a die to a circuit board includes loading a dicing substrate onto a body in which a light source is disposed. The dicing substrate includes a plurality of separated chips attached to each other by an adhesive. The method further includes combining a cover structure with the body such that the dicing substrate is covered by the cover structure. An inner space of the cover structure is sealed by the combined cover structure and body to provide a closed space between the cover structure and the body enclosing the dicing substrate. The method further includes creating a low-oxygen state in the closed space by discharging oxygen from the closed space, and detaching the chips from the adhesive while in the low-oxygen state by illuminating the dicing substrate in the closed space with a light emitted by the light source. Each detached chip is a die. The method further includes picking up one of the dies from the dicing substrate, and bonding the picked-up die to the circuit board.

According to an exemplary embodiment of the inventive concept, a light illuminating apparatus includes a frame including an inner space shaped and dimensioned to accommodate an object, a light source that emits a light, and a driver that brings the frame into contact with the light source by moving the frame toward the light source. When the object is disposed in the inner space, the object is covered by the frame, and the inner space is sealed in response to the frame coming into contact with the light source to provide a closed space enclosing the object. The light illuminating apparatus further includes an oxygen discharger that creates a low-oxygen state in the closed space by discharging oxygen from the closed space.

According to exemplary embodiments of the present inventive concept, the dicing substrate having a plurality of separated chips may be loaded onto the body of the light source, and the cover structure may be combined with the body in such a configuration that the dicing substrate is positioned in the closed space defined by the cover structure and the body. Then, the closed space may be controlled to be a low-oxygen state or a vacuum state. Thus, the photochemical reaction or the hardening process for detaching the chips from the adhesive may occur under a low-oxygen state in the closed space. As a result, the separated chips may be sufficiently detached from the adhesive.

According to exemplary embodiments of the present inventive concept, the operation of the gas supplier/vacuum controller and the operation of the light source may be automatically controlled by the operation controller. As a result, the hardening process under the low-oxygen state may be automatically performed, and detach failures between the chips and the adhesive may be remarkably reduced in the die boding process.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
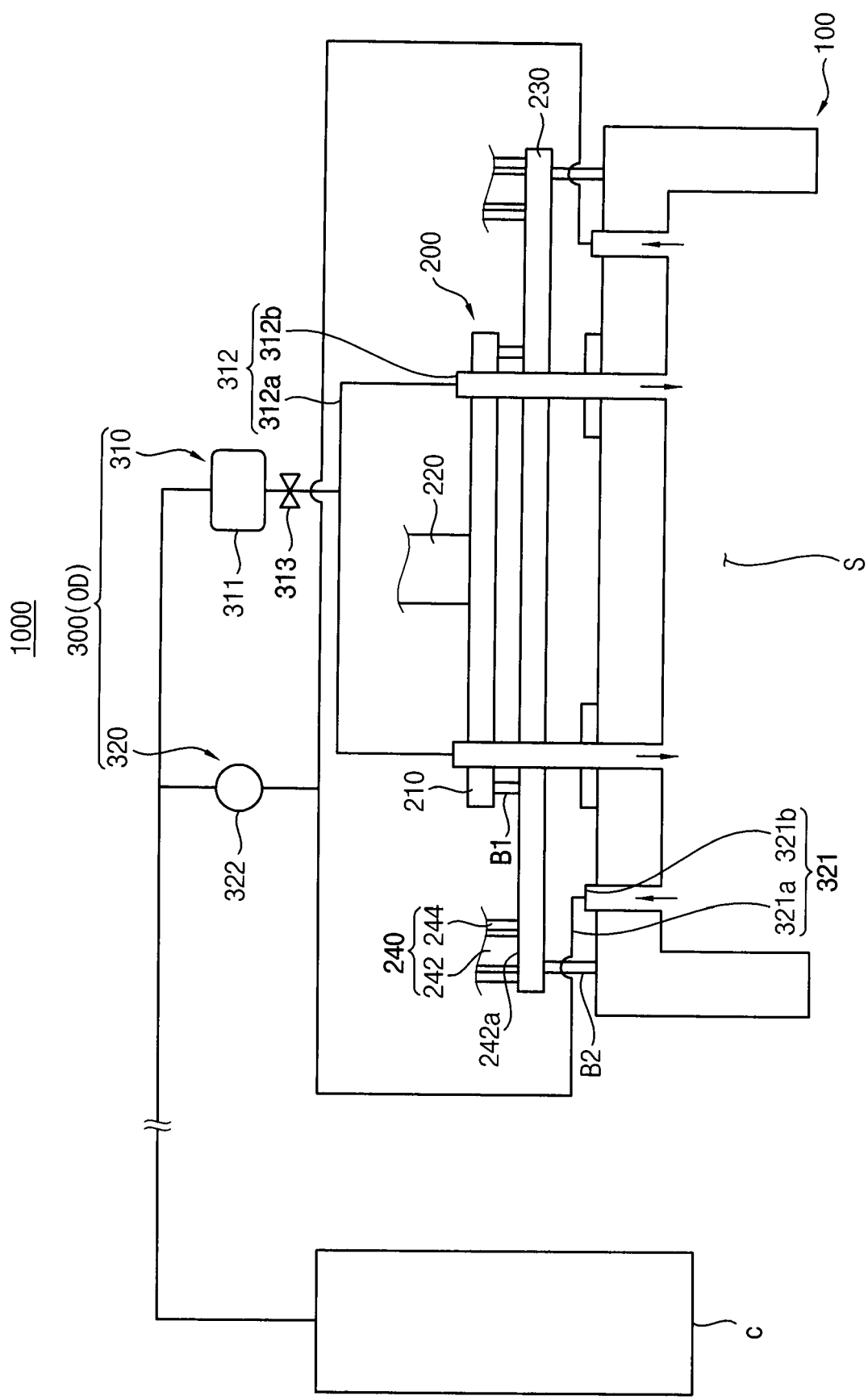
FIG. 1 is a cover structure for a light source according to an exemplary embodiment of the present inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Figure 2A:
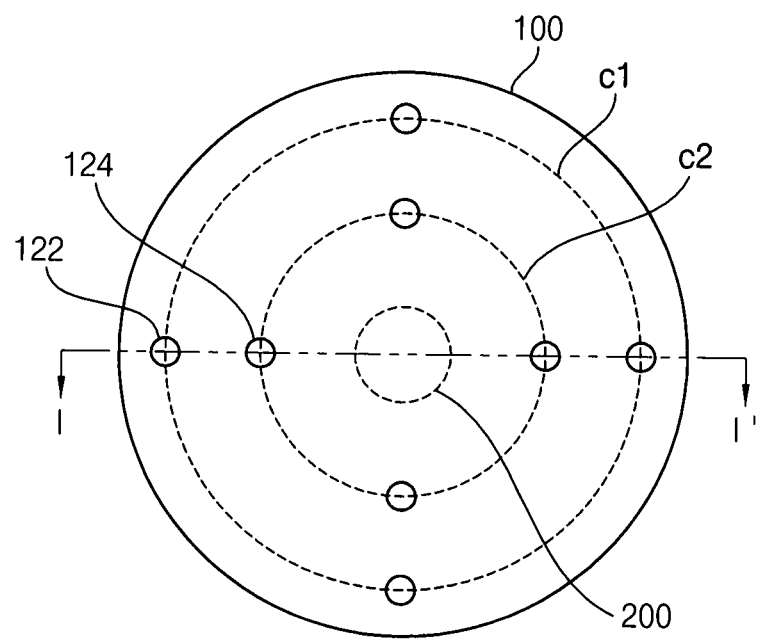
FIG. 2A is a plan view illustrating a frame of the cover structure shown in FIG. 1.
Figure 2B:
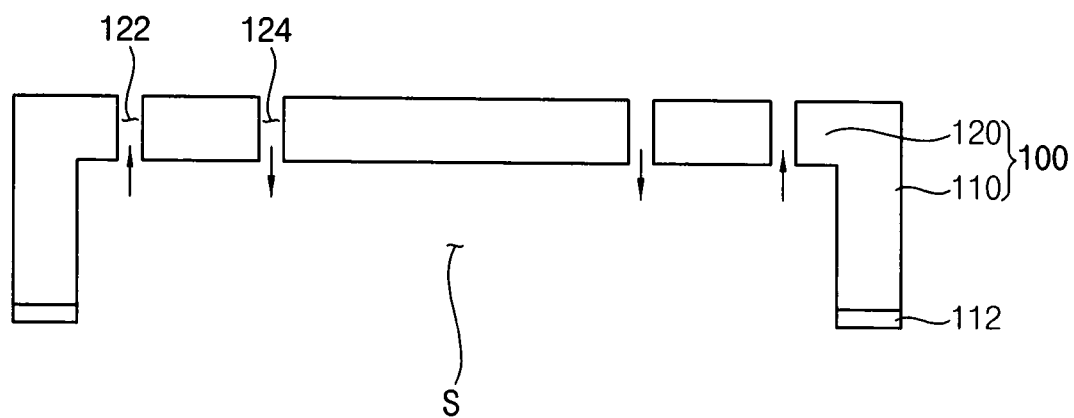
FIG. 2B is a cross-sectional view taken along line I-I' of the frame shown in FIG. 2A.

FIG. 1 is a cover structure for a light source according to an exemplary embodiment of the present inventive concept. FIG. 2A is a plan view illustrating a frame of the cover structure shown in FIG. 1. FIG. 2B is a cross-sectional view taken along line I-I' of the frame shown in FIG. 2A.

Referring to FIGS. 1, 2A and 2B, in an exemplary embodiment, a cover structure 1000 for a light source that emits light onto an object includes a frame 100 having an inner space S. The frame 100 may be combined with the light source in such a configuration that the object may be covered (e.g., entirely covered) by the frame and the inner space S may be defined by the light source to provide a closed space (CS in FIG. 7) enclosing the object, a driver 200 that drives the frame 100 to combine with the light source, and an oxygen discharger OD that discharges oxygen from the closed space CS to generate a low-oxygen state around the object. Herein, the light source that emits light may also be referred to as a ray illuminator that emits light rays. According to exemplary embodiments, the frame 100 being combined with the light source refers to the frame 100 contacting the light source such that it is attached to the light source, as described in further detail below.

In an exemplary embodiment, the oxygen discharger OD that discharges oxygen from the closed space CS may include a gas exchanger 300 that may supply a substitute gas into the closed space CS and that may replace inner gases of the closed space CS with the substitute gas. Thus, the state of the closed space CS may be changed into the low-oxygen state at a high concentration of the substitute gas.

Figure 7:
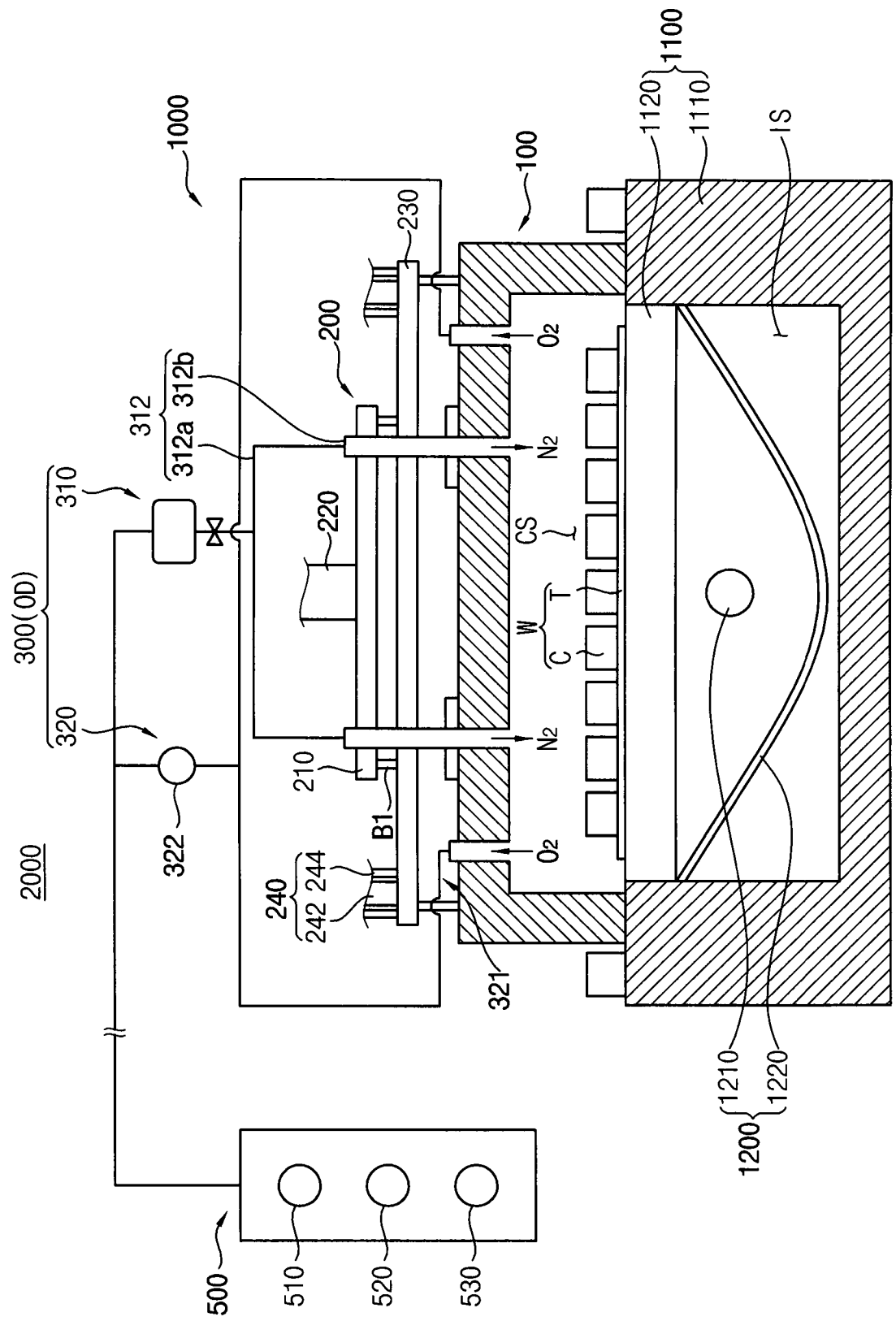
FIG. 7 is a view illustrating an apparatus having the cover structure of FIG. 1 that illuminates a dicing substrate with light according to an exemplary embodiment of the present inventive concept.

For example, the frame 100 may be shaped as a three-dimensional cylindrical or box shape of which a bottom portion may be opened and may be combined with an upper portion of the light source. Thus, the inner space S, which is an open space near the bottom portion of the frame 100, may be defined by the light source. As a result, the inner space S may be formed into a closed space CS, which is shown in FIG. 7. The closed space CS may be sealed from the surrounding area by the light source.

The light source may include a support on which the object may be mounted, and light emitted by the light source may illuminate the object. Then, photochemical reactions may occur at a bottom surface of the object as a result of the light illuminating the object. In an exemplary embodiment, the object may include a separated wafer or a dicing wafer in which a plurality of chips may be separated by a sawing process, and the light source may be an ultraviolet light source that emits ultraviolet light. An ultraviolet tape may be attached to a rear portion of the separated substrate, and the separated chips may be attached to one another by the ultraviolet tape. When ultraviolet rays are illuminated to the rear portion of the dicing wafer by the light source, the adhesive strength of the ultraviolet tape may be weakened or loosened by the photochemical reactions at the boundary area between the ultraviolet tape and the chips.

For example, the frame 100 may include a sidewall 110 that may be combined with a body of the light source and may determine a size of the inner space S, and an upper plate 120 that may be connected to an upper portion of the sidewall 110. In an exemplary embodiment, the upper plate 120 may extend horizontally and the inner space S may be defined by a pair of the sidewalls 110 and the upper plate 120. For example, the frame 100 may be shaped into a cylinder of which a bottom portion is opened, and may be mounted on the light source.

Thus, when the frame is arranged on the light source, the inner space S of the frame 100 may be defined by the light source, and a closed space CS (see FIG. 7) may be provided between the frame 100 and the light source. The object onto which light is emitted by the light source may be positioned in the closed space CS, so the photochemical reactions may occur in the closed space CS under low concentration of oxygen, as described in detail hereinafter.

For example, a sealing member 112 may be provided at a bottom surface of the sidewall 110. As a result, the inner space S may be sufficiently sealed from surroundings when the frame 100 is combined with the light source (e.g., when the frame 100 is mounted to the light source). The sealing member 112 may include, for example, an O-ring and a rubber ring. For example, since the closed space CS is sufficiently sealed from its surroundings, the inner states of the closed space CS may be controlled and adjusted for the photochemical reactions. In addition, the size of the inner space S may be controlled by changing the height of the sidewall 110.

At least one discharge opening 122 and at least one supply opening 124 may be disposed in the upper plate 120. A substitute gas may be supplied into the closed space CS through the supply opening 124, and a discharge gas may be discharged from the closed space CS through the discharge opening 122, as described in detail hereinafter. The inner gases of the closed space CS may be replaced with the substitute gas when the substitute gas is supplied into the closed space CS. The discharge gas may include a mixture of the inner gases and the substitute gas.

A plurality of the discharge openings 122 penetrating through the upper plate 120 may be arranged at the same gap distance along a first circumference c1 having a first radius from a center of the upper plate 120, and a plurality of the supply openings 124 penetrating through the upper plate 120 may be arranged at a same gap distance along a second circumference c2 having a second radius from the center of the upper plate 120. For example, in an exemplary embodiment, the distances (e.g., the gap distances) between adjacent discharge openings 122 of the plurality of discharge openings 122 along the first circumference c1 are the same, and the distances (e.g., the gap distances) between adjacent supply openings 124 of the plurality of supply openings 124 along the second circumference c2 are the same. The second radius of the second circumference c2 may be smaller than the first radius of the first circumference c1.

For example, in an exemplary embodiment, the discharge and the supply openings 122 and 124 may be arranged on the upper plate 120 in such a configuration that a pair of the discharge opening 122 and the supply opening 124 may be arranged on the same radial line. In contrast, in an exemplary embodiment, the discharge opening 122 and the supply opening 124 may be alternately arranged in an angular direction on the upper plate 120, so that the discharge opening 122 and the supply opening 124 may be shifted from each other by the same shift angle.

The discharge opening 122 may be connected to a discharge gas transfer component 321 of a gas discharger 320 (see FIG. 7), and the supply opening 124 may be connected to a supply gas transfer component 312 of a gas supplier 310. The gas discharger 320 may discharge gases from the closed space CS, and the gas supplier 310 may supply the substitute gases to the closed space CS.

In an exemplary embodiment, four supply openings 124 may be arranged along the second circumference c2, and four discharge openings 122 may be arranged along the first circumference c1, as shown in FIG. 2a. However, exemplary embodiments of the inventive concept are not limited thereto. For example, according to exemplary embodiments, the number of the supply openings 124 may be varied in view of the supply efficiency of the substitute gas, and the number of the discharge openings 122 may be varied in view of the concentration of the substitute gas during the photochemical reactions in the closed space CS.

For example, the supply openings 124 may be modified into a plurality of shower holes so as to increase the supply efficiency of the substitute gas.

Figure 3A:
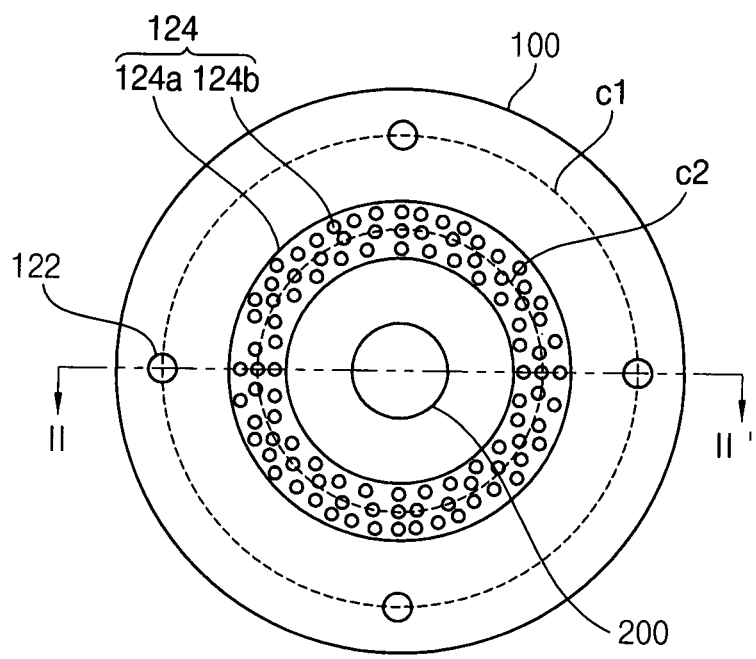
FIG. 3A is a plan view illustrating a first modification of the frame shown in FIG. 2A according to an exemplary embodiment of the present inventive concept.
Figure 3B:
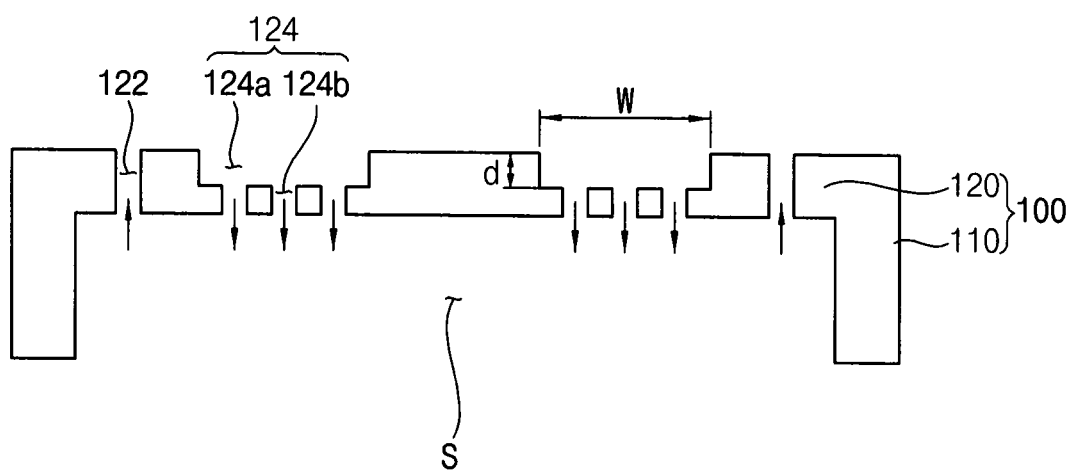
FIG. 3B is a cross-sectional view taken along line II-II' of the first modified frame shown in FIG. 3A.

FIG. 3A is a plan view illustrating a first modification of the frame shown in FIG. 2A according to an exemplary embodiment of the inventive concept. FIG. 3B is a cross-sectional view taken along line II-II' of the first modified frame shown in FIG. 3A.

Referring to FIGS. 3A and 3B, in an exemplary embodiment, an upper surface of the upper plate 120 is recessed to a depth along the second circumference c2, and a supply trench 124a is disposed in the upper plate 120. A plurality of shower holes 124b may be arranged at a bottom of the supply trench 124a. Thus, according to an exemplary embodiment, the supply opening 124 may include the supply trench 124a and the shower holes 124b on the bottom of the supply trench 124a.

The supply trench 124a may have a predetermined depth d from the upper surface of the upper plate 120 along the second circumference c2 and have a width W along the radial direction, so that the supply trench 124a is shaped into a ring along the second circumference c2. In such a case, a supply flow guide 312b (see FIG. 1) may also be shaped into a ring covering the ring-shaped supply trench 124a along the second circumference c2. An inactive gas such as, for example, argon (Ar) and nitrogen (N2) gas may be used as the substitute gas.

The substitute gas may be injected downwards into the closed space CS from the supply trench 124a through the shower holes 124b. As a result, the substitute gas may be uniformly supplied into the closed space CS along the second circumference c2.

The injection power of the substitute gas may be controlled by the number of the shower holes 124b and the supply pressure of the substitute gas. The higher the injection power of the substitute gas, the greater the discharging rate of the inner gases of the closed space CS.

Figure 4A:
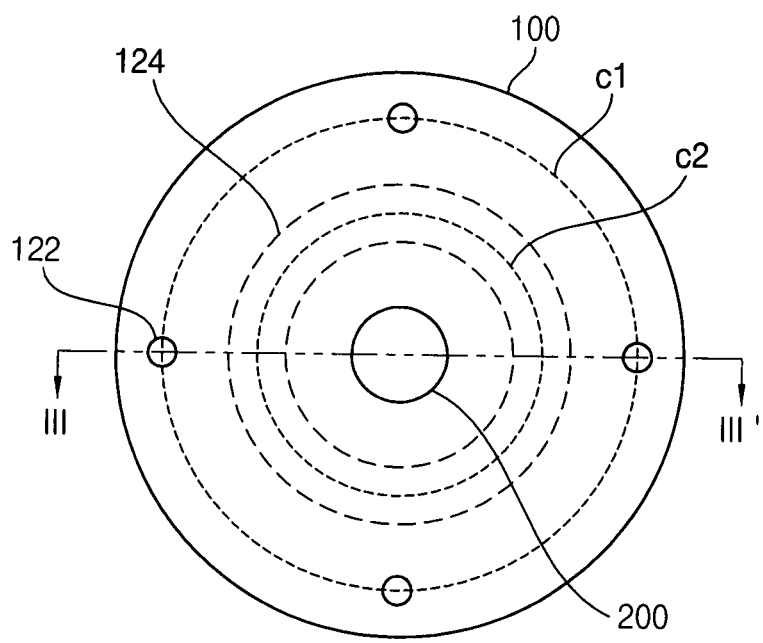
FIG. 4A is a plan view illustrating a second modification of the frame shown in FIG. 2A, according to an exemplary embodiment of the present inventive concept.
Figure 4B:
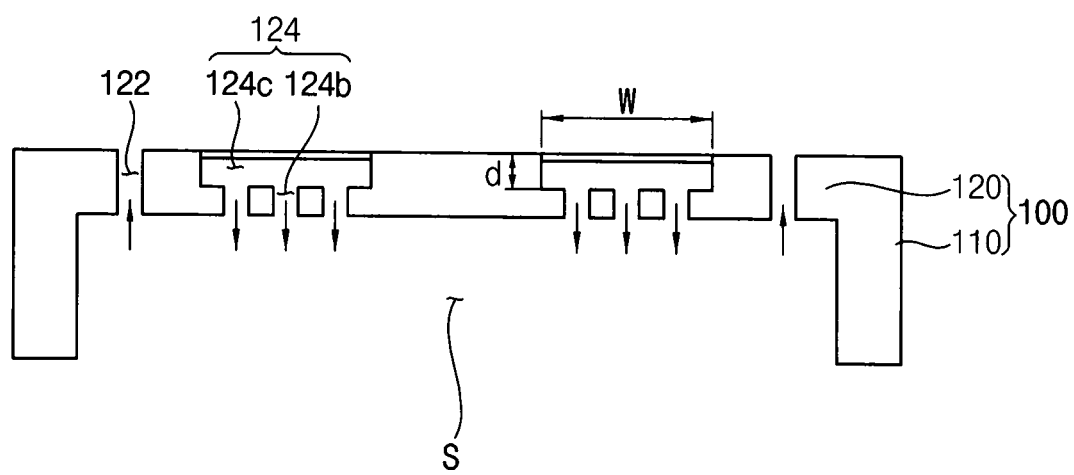
FIG. 4B is a cross-sectional view taken along line III-III' of the second modified frame shown in FIG. 4A.

FIG. 4A is a plan view illustrating a second modification of the frame shown in FIG. 2A according to an exemplary embodiment of the inventive concept. FIG. 4B is a cross-sectional view taken along line III-III' of the second modified frame shown in FIG. 4A.

Referring to FIGS. 4A and 4B, in an exemplary embodiment, the supply opening 124 may include a void ring 124c and a plurality of the shower holes 124b. The void ring 124c may include an empty space in the upper plate 120 extending along the second circumference c2, and the shower holes 124b may be arranged on the bottom of the void ring 124c.

The void ring 124c may include at least one supply gate. The supply flow guide 312b (see FIG. 1) may be connected to the void ring 124c through the supply gate. Thus, the substitute gas may be supplied into the void ring 124c through the supply gate, and may be uniformly injected into the closed space CS through the shower holes 124b.

For example, referring to FIG. 1, the driver 200 may include an aligning guide 210, a driving shaft 220 coupled to the aligning guide 210, an auxiliary plate 230, and a plurality of guide shafts 240 arranged on the auxiliary plate 230 and enclosing the driving shaft 220 at the same gap distance. The driving shaft 220 coupled to the aligning guide 210 linearly moves upwards and downwards. The guide shaft 240 may cause the frame 100 to be in parallel with the light source when the driving shaft 220 moves upwards and downwards.

The aligning guide 210 may include a guide plate that may be detachably secured to the frame 100 by a first securing member B1 such as, for example, a bolt. The driving shaft 220 may be secured to the central portion of the guide plate.

For example, a plurality of penetration holes may be provided at a peripheral portion of the aligning guide 210 and may be connected to the supply openings 124. Thus, the supply flow guide 312b may also be connected to the penetration holes of the aligning guide 210. That is, the aligning guide 210 may be arranged with the frame 100 in such a configuration that the penetration holes of the aligning guide 210 may be aligned with the supply openings 124 of the frame 100.

The driving shaft 220 may be operated, for example, by a piston rod of a hydraulic cylinder or a driving motor. The driving motor may include a servo motor having good position control characteristics and a step motor having good on/off characteristics. Thus, the driving shaft 220 may linearly move upwards and downwards via hydraulic power or electric power.

Since the driving shaft 220 may be connected to the frame 100, the frame 100 may also move linearly upwards and downwards according to the operation of the driving shaft 220 over the light source.

According to exemplary embodiments, the driving shaft 220 may only be operated when needed. For example, various objects may be mounted on the light source, and the cover structure 1000 may only be combined with the light source when the photochemical reaction to the object needs a low-oxygen environment. Thus, in an exemplary embodiment, the driving shaft 220 may move downwards to cause the cover structure 1000 to be combined with the light source only when the oxygen around the object is required to be discharged from the closed space CS, and/or only when the photochemical reaction to the object is required to occur in the low-oxygen state. Therefore, in an exemplary embodiment, when the photochemical reaction to the object does not require the low-oxygen state, the driving shaft 220 does not move and the cover structure 1000 is not combined with the light source. In such a case, the cover structure 1000 may remain in a standby area.

Thus, the cover structure 1000 may be selectively combined with the light source according to the operation of the driving shaft 220.

A plurality of the guide shafts 240 may cause the frame 100 to be in parallel with the light source when the frame 100 moves downwards and upwards over the light source. That is, the guide shaft 240 may ensure the parallel arrangement between the frame 100 and the light source when the frame 100 moves linearly over the light source.

For example, the auxiliary plate 230 may be interposed between the aligning guide 210 and the frame 100, and a plurality of the guide shafts 240 may be arranged at the peripheral portion of the auxiliary plate 230 in such a configuration that the guide shafts 240 are spaced apart from each other at the same gap distance and the driving shaft 220 is enclosed by the guide shafts 240. In an exemplary embodiment in which the parallel arrangement may be sufficiently accomplished between the frame 100 and the light source, the auxiliary plate 230 may be omitted.

The auxiliary plate 230 may have a size smaller than the frame 100 and larger than the aligning guide 210, and may be detachably secured to the frame 100 by a second securing member B2. The second securing member B2 may be, for example, a bolt. Thus, when the auxiliary plate 230 is interposed between the aligning guide 210 and the frame 100, the aligning guide 210 may be secured to a central portion of the auxiliary plate 230 by the first securing member B1 and only the peripheral portion of the auxiliary plate 230 may be exposed. A plurality of the guide shafts 240 may be arranged on the exposed peripheral portion of the auxiliary plate 230.

A plurality of penetration holes may also be provided with the auxiliary plate 230 and may be connected to the supply openings 124 of the frame 100. Thus, the supply flow guide 312b may be connected to all of the penetration holes of the auxiliary plate 230 and the aligning guide 210.

The guide shaft 240 may include a variable rod 242 and a guide shell 244. The variable rod 242 may include an upper securing terminal secured to an upper portion of a fixed area, and a lower securing terminal 242a secured to the auxiliary plate 230. The length of the variable rod 242 may be variable between the upper securing terminal and the lower securing terminal 242a. The variable rod 242 may be enclosed by the guide shell 244. The variable rod 242 may also be referred to herein as a length-variable rod 242.

The length of the variable rod 242 corresponding to a gap distance between the upper securing terminal and the auxiliary plate 230 may be variable in response to the linear motion of the driving shaft 220, and the guide shell 244 may enclose the length-variable rod 242 on the auxiliary plate 230.

When the frame 100 and the light source are not arranged in parallel, and the frame 100 is instead inclined with respect to the light source as it moves upwards and downwards, the variable rod 242 may also be inclined in response to the inclination of the frame 100 and may be contact with the guide shell 244. As a result, the linear movement of the frame 100 may be restricted by the friction between the variable rod 242 and the guide shell 244.

In such a case, the driving shaft 220 may be stopped and parallel arrangement between the frame 100 and the light source may be restored by controlling the position of the frame 100.

The gas exchanger 300 may supply the substitute gas into the closed space CS defined by the frame 100 and the light source, and discharges the oxygen from the closed space CS. Thus, the gas exchanger 300 may control the closed space CS to be a low-oxygen state at a high concentration of the substitute gas.

For example, the gas exchanger 300 may include the gas supplier 310 that supplies the substitute gases into the closed space CS, and the gas discharger 320 that discharges gases from the closed space CS.

The gas supplier 310 may include a reservoir 311 that stores the substitute gases, a supply gas transfer component 312 that may be connected between the reservoir 311 and the supply openings 124 and may transfer the substitute gases to the closed space CS, and a flow controller 313 that may be connected to the supply gas transfer component 312 and may control a flow rate of the substitute gases.

The reservoir 311 may be positioned at a side of the frame 100 and may be connected to the supply gas transfer component 312. The substitute gases in the reservoir 311 may be supplied to the closed space CS via the supply gas transfer component 312. The inner gases in the closed space CS may be discharged from the closed space CS as the substitute gases are supplied into the closed space CS. Accordingly, the oxygen concentration in the closed space CS may be reduced as the inner gases including oxygen are discharged from the closed space CS.

The substitute gas may be a gas that is inactive or a gas that has less reactivity in the photochemical reactions with the object. Thus, the substitute gas may include an inactive gas having an atomic weight greater than oxygen. For example, the substitute gas may include argon (Ar), nitrogen (N2), etc. According to exemplary embodiments, the replacement of the inner gases having oxygen with the substitute gases is efficiently conducted.

However, exemplary embodiments of the inventive concept are not limited thereto. For example, according to exemplary embodiments, an inactive gas having an atomic weight smaller than oxygen such as, for example, helium (He) and neon (Ne), may also be used as the substitute gas under some supply conditions. For example, an inactive gas lighter than oxygen may be supplied into the closed space CS at a high supply pressure and a high flow rate.

The supply gas transfer component 312 may transfer the substitute gases to the closed space CS from the reservoir 311 through the supply openings 124. For example, the supply gas transfer component 312 may include a supply line 312a extending from the reservoir 311 to the supply opening 124 of the frame 100, and the supply flow guide 312b detachably secured to the supply opening 124 and guiding the substitute gas into the closed space CS.

When a plurality of the supply openings 124 is provided with the frame 100, the supply flow guide 312b may be diverged to each of the supply openings 124. As a result, the supply flow guide 132b may be combined with every supply openings 124.

However, when the supply opening 124 includes the supply trench 124a and the shower holes 124b, a single supply flow guide 312b may be combined with the supply trench 124a, and the substitute gases may be supplied into the closed space CS through the shower holes 124b.

In addition, when the supply opening 124 includes the void ring 124c and the shower holes 124b, the supply flow guide 312b may be connected to the supply gate. In such a case, when the void ring 124c includes a plurality of supply gates, the supply line 312a and/or the supply flow guide 312b may be diverged to each of the supply gates.

The flow controller 313 may be arranged on the supply line 312a and may control the flow rate of the substitute gas. For example, the flow controller 313 may include an on/off valve in which the valve opening time may be controlled. Thus, the flow rate of the substitute may be controlled by controlling the valve opening time of the on/off valve.

The gas discharger 320 may include a discharge gas transfer component 321 that transfers a discharge gas from the closed space CS, and a concentration detector 322 that may be arranged on the discharge gas transfer component 321 and that may detect an oxygen concentration from the discharge gas. For example, the concentration detector 322 may include an element analyzer for analyzing components and partial amounts of the discharge gas.

The inner gases in the closed space CS may be discharged outwards from the closed space CS as a mixture of the inner gases and the substitute gas. Thus, the air having oxygen in the closed space CS may be discharged from the closed space CS together with the substitute gas, so that the photochemical reaction to the object may be conducted under the low-oxygen condition in the closed space CS. For example, when the dicing wafer attached by the ultraviolet tape is mounted on an ultraviolet light source, the photochemical reaction between the ultraviolet tape and the chips of the dicing wafer, which is referred to as a hardening process, may be conducted under the low-oxygen condition in the closed space CS.

The concentration detector 322 may detect the partial amount of oxygen in the discharge gas and may provide the oxygen concentration of the discharge gas.

The discharge gas transfer component 321 may include a discharge flow guide 321b detachably secured to the discharge opening 122 that guides the discharge gas out of the closed space CS, and a discharge line 321a connected to the discharge flow guide 321b and through which the discharge gas may flow.

The concentration detector 322 may be arranged at an end portion of the discharge line 321a. A plurality of the discharge openings 122 may be provided with the frame 100, and a local discharge gas may be discharged from each discharge opening 122. The local discharge gas may be transferred outwards through a corresponding local discharge line and may be merged at a main discharge line. The local discharge line may be disposed near the discharge opening 122, and the main discharge line may be disposed relatively further from the discharge opening 122 and may be connected to the local discharge line. Thus, the concentration detector 322 may be arranged at an end portion of the main discharge line, and as a result, may detect an average oxygen concentration of the discharge gas that may be discharged from the closed space CS.

The supply of the substitute gas may be maintained or stopped according to the detected oxygen concentration. The detected oxygen concentration of the discharge gas may indicate an average concentration of oxygen in the mixture of the inner gases and the substitute gas. Thus, the initiation of the photochemical reaction in the closed space CS may be determined by the detected oxygen concentration.

The supply of the substitute gas may be maintained until the detected concentration of oxygen is less than a reference concentration. When the oxygen concentration in the discharge gas is less than the reference concentration, the flow controller 313 may stop the supply of the substitute gas and the photochemical reaction may be initiated in the closed space CS by operating the light source.

The stopping of the substitute gas supply and the operation of the light source may be manually conducted or may be automatically conducted by a central controller c, in which various operation algorithms may be installed. The central controller c may include, for example, a memory that stores a computer program that implements the various operation algorithms, and a processor that executes computer program.

The gas supplier 310 and the gas discharger 320 may be automatically controlled by the central controller c in such a configuration that the substitute gas is supplied into the closed space CS when the oxygen concentration in the discharge gas is greater than the reference concentration, and may be stopped when the oxygen concentration in the discharge gas is less than the reference concentration. Thus, the oxygen concentration may be maintained to be less than the reference concentration in the closed space CS.

Figure 5:
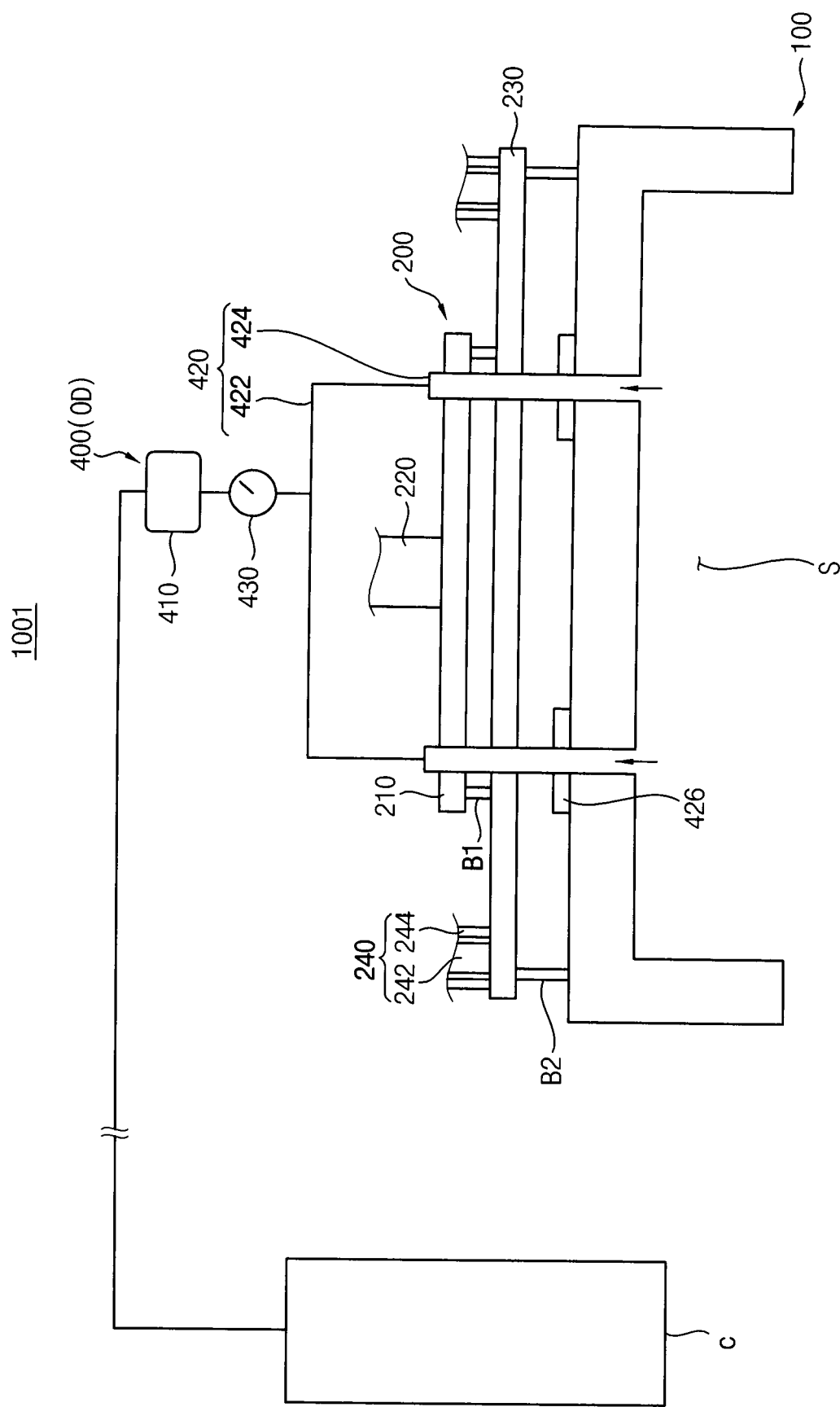
FIG. 5 is a cover structure for a light source according to an exemplary embodiment of the present inventive concept.
Figure 6A:
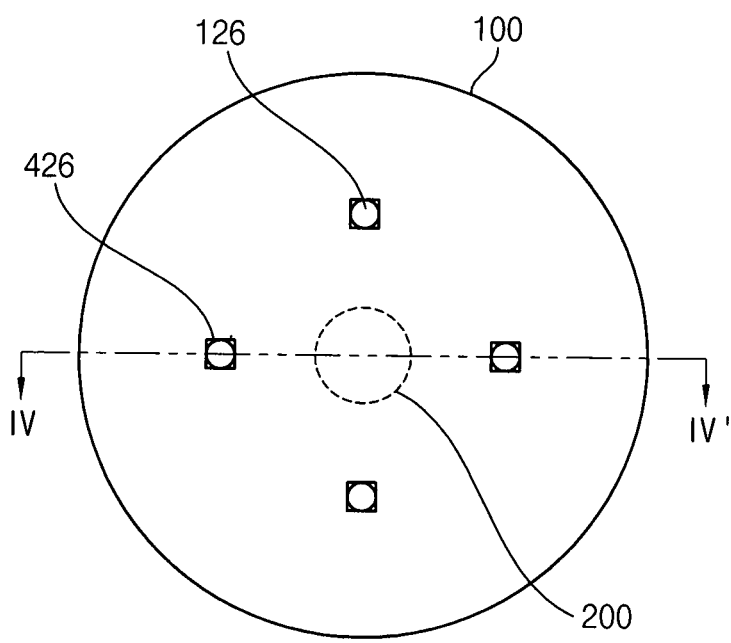
FIG. 6A is a plan view illustrating a frame of the cover structure shown in FIG. 5.
Figure 6B:
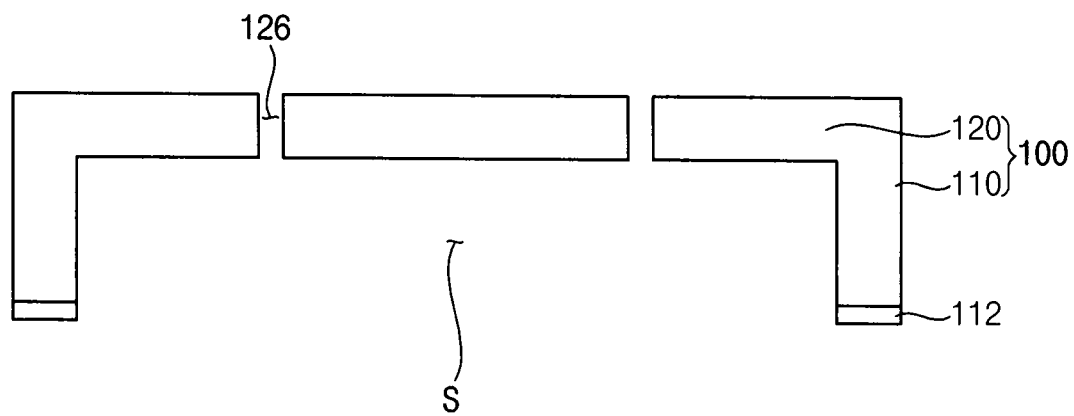
FIG. 6B is a cross-sectional view taken along line IV-IV' of the frame shown in FIG. 6A.

FIG. 5 is a cover structure for a light source according to an exemplary embodiment of the present inventive concept. FIG. 6A is a plan view illustrating a frame of the cover structure shown in FIG. 5. FIG. 6B is a cross-sectional view taken along line IV-IV' of the frame shown in FIG. 6A. The cover structure shown in FIGS. 5, 6A and 6B has substantially the same structures as the cover structure shown in FIGS. 1 to 4B, except that the gas exchanger is replaced with a vacuum controller. Thus, in FIGS. 5, 6A and 6B, the same reference numerals denote the same elements in FIGS. 1 to 4B. In addition, for convenience of explanation, a further detailed description of elements previously described will be omitted hereinafter.

Referring to FIGS. 5, 6A and 6B, a cover structure 1001 for a light source according to an exemplary embodiment of the present inventive concept includes a vacuum controller 400 that removes the inner gases of the closed space CS outwards, and that generates a substantial vacuum state in the closed space CS. That is, the closed space CS may be put into the low-oxygen state by the vacuum controller 400.

In an exemplary embodiment, a plurality of suction holes 126 may be disposed in the frame 100. A suction hole 126 may be connected to a vacuum transfer component 420 described in detail hereinafter, and the vacuum pressure may be applied to the closed space CS via the vacuum transfer component 420 and the suction hole 126.

For example, the vacuum controller 400 may include a vacuum generator 410 that generates a vacuum pressure, a vacuum transfer component 420 that transfers the vacuum pressure to the closed space CS through the suction hole 126 penetrating through the frame 100, and a vacuum sensor 430 arranged on the vacuum transfer component 420 that detects an inner vacuum pressure of the closed space CS.

The vacuum generator 410 may include a vacuum pump that sucks up the inner gases of the closed space CS. In an exemplary embodiment, the vacuum pump may include an air pump and a diffusion pump by which the inner pressure of the closed space CS may be reduced to less than about $10^{-2}$ mmHg.

The vacuum transfer component 420 may transfer the vacuum pressure to the closed space CS from the vacuum generator 410. Thus, the inner gases of the closed space CS may be discharged outwards from the closed space CS through the vacuum transfer component 420 until the inner pressure of the closed space CS is less than about a reference vacuum pressure.

For example, the vacuum transfer component 420 may include a vacuum line 422 extending from the vacuum generator 410 to the closed space CS, and a suction guide 424 detachably secured to the suction hole 126 that sucks the inner gases out from the closed space CS proportional to the vacuum pressure.

The vacuum line 422 may include, for example, a steel tube having sufficient rigidity and stiffness for the vacuum pressure that may be generated by the vacuum generator 410, and the suction guide 424 may include, for example, a connection tube that may be combined with the suction hole 126. For example, the suction guide 424 may be secured to the frame 100 around the suction hole 126 by a joint nut 426 to improve combination facilities and combination seal.

Thus, the vacuum pressure generated by the vacuum generator 410 may be sufficiently transferred to the closed space CS.

The vacuum sensor 430 may be arranged on the vacuum line 422 and may detect the inner vacuum pressure of the closed space CS. For example, the vacuum line 422 may include a thermal conduction vacuum gauge that may detect an inner pressure of the vacuum line 422 based on the thermal conduction through the vacuum line 422, and an ionization vacuum gauge that may detect a particle density of gases flowing through the vacuum line 422. That is, the inner vacuum pressure of the closed space CS may be obtained just by detecting the inner pressure or the particle density of the gases flowing through the vacuum line 422. The vacuum sensor 430 may detect the inner vacuum pressure of the closed space CS in real-time.

The initiation of the photochemical reaction may be determined by the detected vacuum pressure of the closed space CS. A maximum vacuum pressure that may be utilized without damaging the object may be set as the reference vacuum pressure, and the detected vacuum pressure of the closed space CS may be compared with the reference vacuum pressure. When the detected vacuum pressure is less than or about equal to the reference vacuum pressure, the vacuum controller 400 may be stopped and the photochemical reaction may be initiated in the closed space CS under a substantial vacuum state or a low-oxygen state.

The stopping of the vacuum controller 400 and the operation of the light source may be manually conducted or may be automatically conducted by a central controller c in which various operation algorithms may be installed, as described above.

According to the cover structure 1001 of the light source, the object may be loaded onto the light source and the cover structure 1001 may be combined with the light source in such a configuration that the object is positioned in the closed space CS defined by the cover structure 1001 and the light source. Then, the inner gases in the closed space CS may be discharged and the oxygen concentration may be reduced under the reference concentration. Thus, the photochemical reaction to the object may occur under a low-oxygen state in the closed space CS, thereby reducing the reaction failures of the photochemical reaction caused by oxygen.

FIG. 7 is a view illustrating an apparatus having the cover structure of FIG. 1 that illuminates a dicing substrate with light according to an exemplary embodiment of the present inventive concept.

Referring to FIG. 7, in an exemplary embodiment, an apparatus 2000 (hereinafter referred to as a light illuminating apparatus) that emits light, which illuminates an object such as a dicing substrate, includes a body 1100 having a housing 1110 and a transparent support structure 1120 that may cover a portion of the housing 1110 (e.g., a portion near the top of the housing) and may support the dicing substrate W in which a plurality of separated chips C may be attached to one another into the same shape of the substrate W by an adhesive T. The light illuminating apparatus 2000 further includes a light source 1200 arranged in the body 1100. The light source 1200 may correspond to the light source described above. Light emitted by the light source 1200 illuminates the dicing substrate W to separate the chips and the adhesive T as a die. A cover structure 1000 is combined with the body 1100 and covers the dicing substrate W.

The housing 1110 may be shaped as a top-opened three-dimensional shape and may have an illumination space IS therein. For example, in an exemplary embodiment, the housing 1110 may have a three-dimensional shape with an open top, in which the open top is the only open portion of the three-dimensional shape. The transparent support structure 1120 may cover a portion of the housing 1110 in such a configuration that the light generated from the illumination space IS may pass through the transparent support structure 1120 and may reach the dicing substrate W on the transparent support structure 1120. For example, the transparent support structure 1120 may be disposed near the top portion of the housing 1110 in an area corresponding to the open top of the housing 1110. For example, in an exemplary embodiment, the transparent support structure 1120 may be disposed in the open top of the housing 1110 near the top portion of the housing 1110.

The housing 1110 may support the cover structure 1000 and may hold the light source 1200 in the illumination space IS. Thus, the housing 1110 may have a sufficient rigidity to support the cover structure 1000.

For example, the housing 1110 may have a sufficient thickness for providing an upper surface on which the cover structure may be positioned, and a wafer ring enclosing the dicing substrate W may be arranged after separation from the dicing substrate W.

In addition, an upper portion of the housing 1110 may be made of an elastic member with which the sealing member 112 of the frame 100 may make contact. As a result, the closed space CS may be sufficiently sealed from its surroundings.

The transparent support structure 1120 may cover an upper portion of the housing 1110 in such a configuration that the illumination space IS is closed from its surroundings. The transparent support structure 1120 may be shaped as a flat plate, so that the dicing substrate W may be positioned stably on the transparent support structure 1120. The transparent support structure 1120 may have sufficient light transmittance such that the light generated in the illumination space IS can pass through the transparent support structure 1120 and reach the rear portion of dicing substrate W. For example, the transparent support structure 1120 may include a glass substrate.

The dicing substrate W may include a silicon wafer on which a plurality of chips may be manufactured by a series of semiconductor manufacturing processes. The chips may subsequently be separated from one another by a sawing process. After the sawing process, the adhesive T (e.g., an ultraviolet tape) may be attached to the rear portion of the dicing substrate W. As a result, the separated chips may be attached to one another while maintaining the original shape of the silicon wafer. The ultraviolet tape T may be hardened by the photochemical reactions that may be activated by ultraviolet rays. When the ultraviolet tape T is sufficiently hardened, the chips attached to the ultraviolet tape T may be separated individually and may be provided as a die. The die may be individually provided into a packaging process such as, for example, a die bonding process.

The dicing substrate W may have the same shape in spite of the sawing process due to the wafer ring tightly enclosing the dicing substrate along a contour of the original substrate. The dicing substrate W enclosed by the wafer ring may be transferred to the light illuminating apparatus 2000 by a wafer cassette. Then, the dicing substrate W enclosed by the wafer ring may be taken our of the wafer cassette and may be loaded onto the transparent support structure 1120. When the dicing substrate W is positioned on the transparent support structure 1120 and is accurately aligned with an illumination point of the light source 1200, the wafer ring may be separated from the dicing substrate W and may remain on the upper surface of the housing 1110 aside from the dicing substrate W.

The light source 1200 may be positioned in the illumination space IS and may generate the light. The light may reach the dicing substrate W by passing through the transparent support structure 1120.

For example, the light source 1200 may include a light emitting unit 1210 that generates light that activates the photochemical reactions to the adhesive T, and a reflector 1220 that reflects the light toward the dicing substrate W.

In an exemplary embodiment, since the adhesive T may include an ultraviolet tape, the light emitting unit 1210 may include an ultraviolet light generator. The ultraviolet light may activate the photochemical reaction to the ultraviolet tape. As a result, the chips may be separated into the die by the ultraviolet light.

The light generated from the light emitting unit 1210 may radiate in all directions. As a result, some of the generated light may pass toward a bottom portion of the housing 1110 (hereinafter, referred to as downward light rays). In exemplary embodiments, the downward light rays do not have an effect on the photochemical reactions to the adhesive T. Thus, the optical efficiency of the generated light may be reduced due to the downward light rays. In an exemplary embodiment, the downward light rays may be reflected to the transparent support structure 1120 by the reflector 1220, and the optical efficiency of the generated light rays may be sufficiently increased. The reflector 1220 may have various shapes that permit the reflection ratio of the downward light rays to be sufficiently high.

The cover structure 1000 may have substantially the same structure as the cover structures 1000 and 1001 described with reference to FIGS. 1 to 6B. Accordingly, for convenience of explanation, a further detailed description of the cover structure 1000 will be omitted hereinafter.

The light illuminating apparatus 2000 may be manually operated or may be automatically operated by an operation controller 500. The operation controller 500 may control the light source 1200 as well as the cover structure 1000. The operation controller 500 may include, for example, a memory that stores a computer program that implements various operation algorithms, and a processor that executes computer program.

For example, the operation controller 500 may include a data storing unit 510 that stores a detected oxygen concentration and a reference oxygen concentration, a cover control unit 520 that automatically discharges oxygen from the closed space CS in response to the comparison of the detected oxygen concentration with the reference oxygen concentration, and a light emitting control unit 530 that automatically causes the light emitted by the light source 1200 to illuminate the dicing substrate W in response to the comparison of the detected oxygen concentration with the reference oxygen concentration.

The detected oxygen concentration in the closed space CS may be detected by the concentration detector 322 and may be transferred to the data storing unit 510 as a digital data. The reference oxygen concentration may be defined via a user interface and may also be transferred to the data storing unit 510 as digital data. The reference oxygen concentration may be determined in consideration of the adhesive characteristics and the device characteristics of the body 1100 and the light source 1200.

When the detected oxygen concentration is transferred to the data storing unit 510, the operation controller 500 may compare the detected oxygen concentration with the reference oxygen concentration. In an exemplary embodiment, the reference oxygen concentration may in the range of about 3% to about 10%.

When the detected oxygen concentration is less than the reference oxygen concentration, the cover control unit 520 may control the gas supplier 310 to stop the supply of gas. The cover control unit 520 may determine an idle time of the gas supplier 310 in consideration of the detected oxygen concentration and the flow rate of the discharge gas. Then, the cover control unit 520 may stop the gas supplier 310 during the idle time. Thus, the supply of the substitute gas to the closed space CS may be stopped during the idle time.

As the cover control unit 520 stops the gas supplier 310, the light emitting control unit 530 may control the light source 1200 to operate. Thus, the light rays may be generated from the light emitting unit 1210 and may be illuminated to the adhesive T passing through the transparent support structure 1120 during the idle time.

In an exemplary embodiment, the photochemical reaction may occur at the ultraviolet tape by the ultraviolet rays under the low-oxygen state in the closed space CS defined by the cover structure 1000 and the body 1100. When the gas supplier 310 is operated by the cover control unit 520 and the substitute gas is supplied into the closed space CS, the photochemical reaction of the ultraviolet tape may occur under the high concentration of the substitute gas and the low concentration of oxygen state. For example, the substitute gas may include nitrogen (N2) gases or argon (Ar) gases.

When the gas supplier 310 is stopped, the oxygen concentration may increase again in the closed space CS due to the introduction of air from the surroundings due to an insufficient sealing of the frame 100. Thus, the light emitting control unit 530 may control the light source 1200 to operate in a proper working time for which the average oxygen concentration in the closed space CS is smaller than the reference oxygen concentration without operation of the gas supplier 310. In an exemplary embodiment, the working time of the light source 1200 may be in the range of about 5 seconds to about 20 seconds in consideration of the tape thickness of the ultraviolet tape and the configurations of the body 1100 and the light source 1200.

Accordingly, the photochemical reaction of the adhesive T or the hardening process of the ultraviolet tape may occur under the high substitute gas concentration and the low-oxygen state. As a result, the separated chips C of the dicing substrate W may be sufficiently detached from the adhesive T.

When the light illuminating apparatus 2000 includes the vacuum controller 400, the operation of the cover structure 1000 may also be controlled by the cover control unit 520.

The detected vacuum pressure of the closed space CS may be detected by the vacuum sensor 430 and may be transferred to the data storing unit 510 as digital data. The reference vacuum pressure may be set via a user interface and may also be transferred to the data storing unit 510 as digital data. When the detected vacuum pressure is transferred to the data storing unit 510, the operation controller 500 may compare the detected vacuum pressure with the reference vacuum pressure. When the detected vacuum pressure reaches the reference vacuum pressure, the cover control unit 520 may control the vacuum controller 400 to stop, and the light emitting control unit 530 may control to operate the light source 1200. Thus, the light rays may be generated by the light emitting unit 1210 and may illuminate the adhesive T by passing through the transparent support structure 1120. The separated chips C of the dicing substrate W may be detached from the adhesive T and may be formed into the die.

In an exemplary embodiment, the reference vacuum pressure may be in the range of about $10^{-2}$ mmHg to about $10^{-4}$ mmHg, and the vacuum controller 400 may include a vacuum pump such as, for example, an air pump or a diffusion pump.

Accordingly, the photochemical reaction of the adhesive T or the hardening process of the ultraviolet tape may occur under the vacuum state, and the hardening failures of the ultraviolet tape caused by oxygen (O2) may be sufficiently prevented in the closed space CS. Thus, the separated chips C of the dicing substrate W may be sufficiently detached from the adhesive T.

According to the cover structure and the light illuminating apparatus according to exemplary embodiments of the inventive concept, the dicing substrate having a plurality of separated chips may be loaded onto the body of the light source and the cover structure may be combined with the body in such a configuration that the dicing substrate is positioned in the closed space CS defined by the cover structure and the body. Then, the closed space may be controlled to be a low-oxygen state or a vacuum state. Thus, the photochemical reaction or the hardening process for detaching the chips from the adhesive may occur under the low-oxygen state in the closed space CS. As a result, the separated chips C may be sufficiently detached from the adhesive T.

According to exemplary embodiments, the operation of the gas supplier/vacuum controller and the operation of the light source may be automatically controlled by the operation controller. As a result, the hardening process under low oxygen conditions may be automatically conducted, and detach failures between the chips and the adhesive may be remarkably reduced in the die boding process.

Hereinafter, a method of bonding a die to a circuit board using the light illuminating apparatus 2000 will be described in detail.

Figure 8:
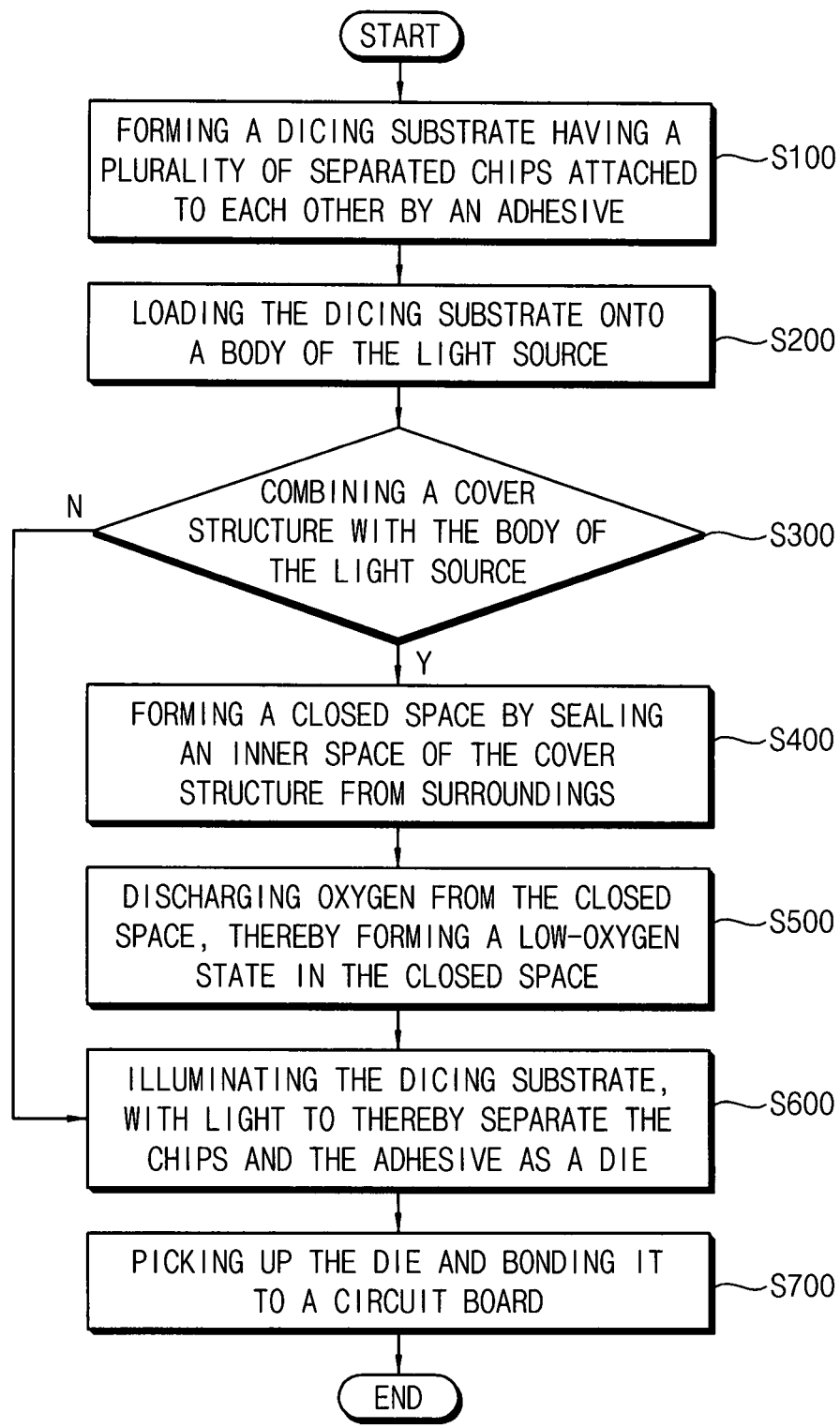
FIG. 8 is a flow chart showing a method of bonding a die to a circuit board using the light illuminating apparatus shown in FIG. 7 according to an exemplary embodiment of the present inventive concept.
Figure 9:
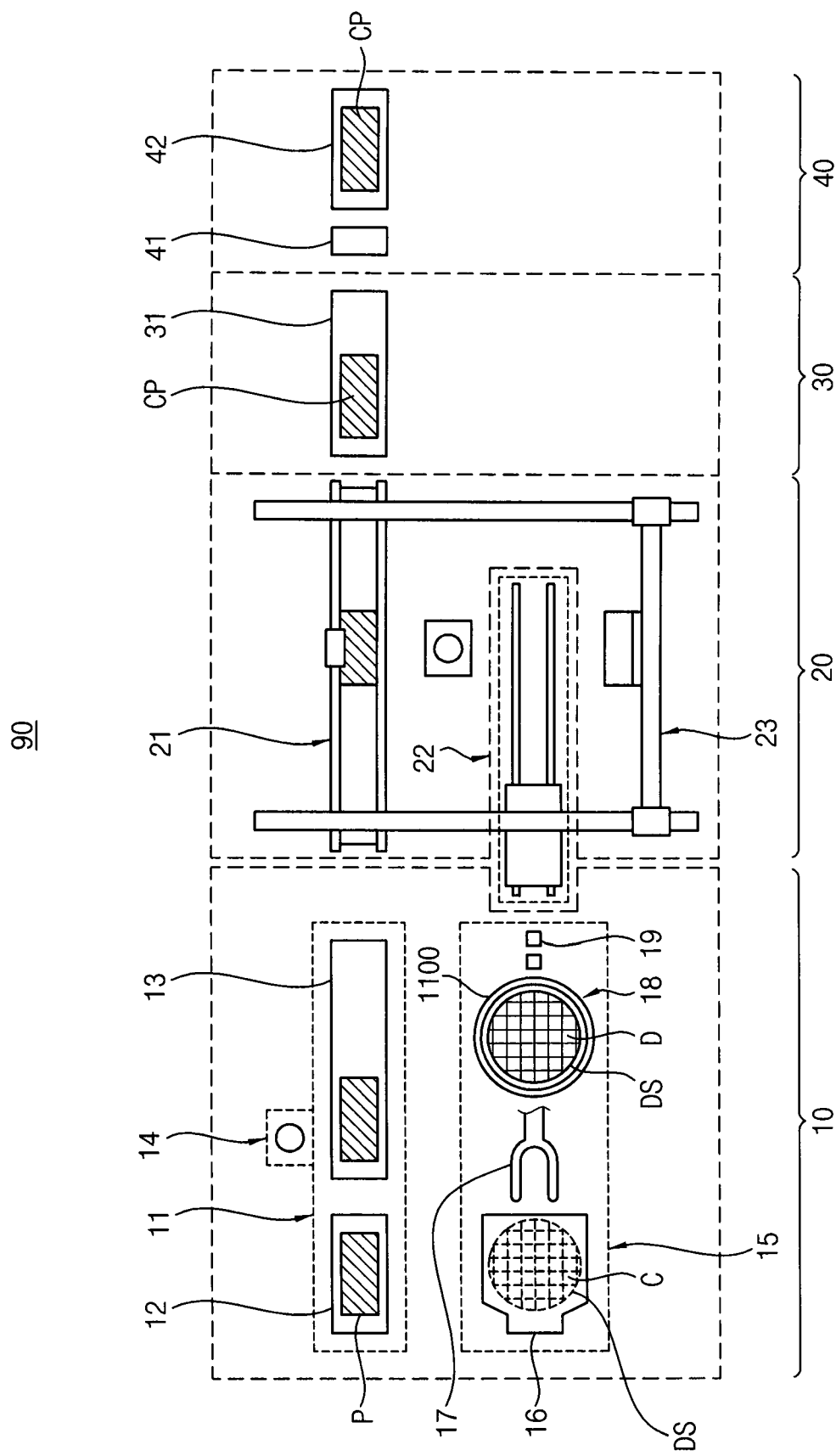
FIG. 9 is a structural view illustrating a die bonding apparatus including the light illuminating apparatus shown in FIG. 7 according to an exemplary embodiment of the present inventive concept.

FIG. 8 is a flow chart showing a method of bonding a die to a circuit board using the light illuminating apparatus shown in FIG. 7 according to an exemplary embodiment of the present inventive concept. FIG. 9 is a structural view illustrating a die bonding apparatus including the light illuminating apparatus shown in FIG. 7 according to an exemplary embodiment of the present inventive concept.

Referring to FIGS. 8 and 9, a plurality of chips C may be manufactured on a substrate by a series of semiconductor manufacturing processes, and a back grinding process and a sawing process may be performed on the substrate having the chips C. Thereafter, an adhesive such as, for example, an ultraviolet tape, may be attached to a rear portion of the substrate W. Thus, the substrate W having the chips C may be formed into a dicing substrate DS having a plurality of the separated chips C in the same shape of the substrate W (operation S100).

For example, the substrate W may include a semiconductor substrate such as a silicon wafer, and the chip C may include a semiconductor chip such as a memory chip or a logic chip. For example, the memory chip may include a flash memory chip or a DRAM memory chip, and the logic chip may include an application processor (AP) chip.

When the semiconductor manufacturing processes are completed, the back grinding process may be performed on the substrate W, and the adhesive, known as an expanding tape, may be attached to the rear portion of the grinded substrate. Thereafter, the sawing process may be conducted along a scribe line. Thus, the substrate W may be formed into the dicing substrate DS having a plurality of the separated chips C.

Although the chips C may be separated from one another in the dicing substrate DS, the adhesive may attach the separated chips C to one another, and thus, the contour or the shape of the dicing substrate DS may be the same as the substrate W. Thus, the separated chips C may be transferred to the die bonding process not by the chip, but by the dicing substrate DS.

After completing the sawing process, the dicing substrate DS may be stacked in a wafer cassette 16 and may be transferred to a chip provider 15 of a die bonding apparatus 90. The chip provider 15 may constitute a loading unit 10 of the die bonding apparatus 90 together with a board provider 11. The chip provider 15 may pick up the chips individually from the dicing substrate DS, and may provide the picked-up chip to a mounting unit 20 as a die. The board provider 11 may provide a board P to the mounting unit 20. The die may be bonded to the board P in the mounting unit 20.

The dicing substrate DS may be loaded onto the light illuminating apparatus 2000 of the chip provider 15 (operation S200).

Since the separated chips C of the dicing substrate DS may be attached to one another by the adhesive in the same shape of the substrate W, the dicing substrate DS may be stacked in the wafer cassette 16 just like a wafer. Thus, a plurality of the chips C may be simultaneously transferred to the die bonding apparatus 90 as the configuration that a plurality of the chips C may be attached by the adhesive, and the dicing substrate DS may be tightly enclosed by the wafer ring.

Then, the dicing substrate DS may be individually taken out of the wafer cassette 16 by a wafer transfer unit 17 such as, for example, a robot arm, and may be loaded onto a light illuminating apparatus 18.

The light illuminating apparatus 18 may have substantially the same structure as the light illuminating apparatus 2000 of FIG. 7. Thus, the light illuminating apparatus 18 may include a body 1100 having the transparent support structure 1120 that supports the dicing substrate DS, the light source 1200 arranged in the body 1100 and emitting light rays such that they illuminate the dicing substrate DS to separate the chips and the adhesive as a die, and a cover structure 1000 combined with the body 1100 and covering the dicing substrate DS. The cover structure 1000 may be selectively combined with the body 1100 when the photochemical reaction is needed for the dicing substrate DS.

Since the light illuminating apparatus 18 may have substantially the same structure as the light illuminating apparatus 2000, the light illuminating apparatus in FIG. 9 may have the same elements as the light illuminating apparatus 2000 in FIGS. 5 to 6B. Thus, the same reference numerals of the light illuminating apparatus in FIG. 9 denote the same elements of the light illuminating apparatus 2000 shown in FIGS. 5 to 6B.

When the dicing substrate DS is loaded onto the body 1100 of the light illuminating apparatus 18, the operation controller 500 may determine whether the light should be emitted to illuminate the dicing substrate DS in the low-oxygen state. Thus, the cover structure 1000 is combined with the body 1100 (operation S300).

For example, when the dicing substrate DS has a relatively large size compared to the size of the cover structure 1000, the combination of the cover structure 1000 with the body 1100 may not be required. In addition, when the photochemical reaction for the detachment between the adhesive and the chip C does not require the low-oxygen state, the combination of the cover structure 1000 with the body 1100 may not be required.

An operator may manually determine whether the cover structure 1000 is to be combined with the body 1100, or the operation controller 500 may determine whether the cover structure 1000 is to be combined with the body 1100.

When the low-oxygen state is required for the detachment of the chips C from the adhesive, the cover structure 1000 may be combined with the body 1100 in such a configuration that the dicing substrate DS is covered by the cover structure 1000 and the inner space S of the frame 100 is sufficiently sealed from its surroundings (operation S400). Thus, the inner space S of the frame 100 may form the closed space CS in which the dicing substrate DS is positioned.

For example, the driving shaft 220, which may be secured to the frame 100 of the cover structure 1000, may move downwards, and the frame 100 may be combined with the body 1100. For example, the frame 100 may come into contact with the body 1100 such that it is attached to the body 1100. In such a case, the sealing member 112 of the frame 100 may make contact with the upper surface of the body 1100, and the inner space S of the frame 100 may be sufficiently sealed from its surroundings by the sealing member 112. That is, the inner space S of the frame 100 may be sufficiently sealed such that characteristics of the area disposed outside of the inner space S has no effect on the sealed inner space S. The driving shaft 220 may be operated using, for example, a driving motor or a hydraulic cylinder.

Then, oxygen of the closed space CS may be sufficiently discharged, and a low-oxygen state may be formed in the closed space CS (operation S500).

The detachment between the adhesive T and the chip C may be insufficient according to the characteristics of the adhesive T due to the oxygen in the air of the closed space CS. For example, when the chips C are attached by an ultraviolet tape, the oxygen in the air may obstruct the photochemical reaction of the ultraviolet tape. That is, the ultraviolet tape may not be sufficiently hardened by the ultraviolet light rays due to the oxygen in the air. In such a case, the chips C may not be sufficiently detached from the ultraviolet tape.

Thus, in such a case, the oxygen of the closed space CS should be removed for a sufficient hardening of the ultraviolet tape.

For example, the air in the closed space CS may be replaced with the substitute gases by using the gas exchanger 300 shown in FIGS. 1 to 4B so as to reduce the oxygen concentration in the closed space CS. Inactive gases such as, for example, argon (Ar) and nitrogen (N2) may be supplied into the close space CS, and the air may be discharged from the closed space CS by the substitute gases.

The substitute gases may be locally supplied into the closed space CS through the supply openings 124, and may be uniformly supplied into the closed space CS through the shower holes 124*b*.

The oxygen concentration may be detected from the discharge gases, and the substitute gas may be supplied into the closes space CS until the detected oxygen concentration is less than the reference oxygen concentration. Thus, the closed space CS may be formed into the low-oxygen state and the dicing substrate DS maybe illuminated with the ultraviolet rays. Accordingly, the hardening process of the ultraviolet tape may be conducted in the closed space CS under the low-oxygen state and the high concentration of the inactive gas.

In a modified exemplary embodiment, the air in the closed space CS may be sufficiently discharged from the closed space CS by using the vacuum controller 400 shown in FIGS. 5 to 6B so as to reduce the oxygen concentration in the closed space CS.

Vacuum pressure may be generated by the vacuum generator 410 and may be applied to the closed space CS through the vacuum transfer component 420. Thus, the air in the closed space CS may be sufficiently sucked out from the closed space CS by the vacuum pressure. The inner vacuum pressure of the closed space CS may be detected from vacuum line 422 and the vacuum pressure may be applied to the closed space CS until the detected vacuum pressure reaches the reference vacuum pressure. Thus, the air may be sufficiently discharged from the closed space CS and the closed space CS may be substantially in a vacuum state.

Accordingly, the hardening process of the ultraviolet tape may be conducted in the closed space CS under a substantially oxygen free state, thereby reducing the detachment failures between the chips and the ultraviolet tape.

When the oxygen concentration is sufficiently reduced in the closed space CS, the light rays may illuminate the dicing substrate DS and the chips C may be detached from the adhesive T as a die (operation S600).

The dicing substrate DS may be positioned on the transparent support structure 1120, and the light source 1200 may be positioned under the transparent support structure 1120. Thus, the light rays generated from the light emitting unit 1210 may pass through the transparent support structure 1120 and may reach the rear portion of the dicing substrate DS. In an exemplary embodiment, the light emitting unit 1210 may generate an ultraviolet light ray.

The ultraviolet tape may be hardened by the ultraviolet light rays in the closed space CS. For example, the hardening process or the photochemical reactions caused by the ultraviolet light rays may be conducted under the low-oxygen state. As a result, the detach failures between the ultraviolet tape and the chips C may be sufficiently prevented or reduced in the light illuminating apparatus 18.

In an exemplary embodiment, the hardening process or the photochemical reactions to the adhesive T may be conducted under the nitrogen (N2) or argon (Ar) atmosphere or under the vacuum.

For example, the gas exchanger 300, the vacuum controller 400, and the light source 1200 may be automatically controlled by the operation controller 500, so that the photochemical reaction to the adhesive T may be automatically conducted in the closed space CS of the light illuminating apparatus 18.

For example, the detected oxygen concentration, the reference oxygen concentration, the detected vacuum pressure, and the reference vacuum pressure may be stored in the data storing unit 510. The operation controller 500 may compare the detected concentration with the reference concentration. When the detected concentration is smaller than the reference concentration, the cover control unit 520 may control the gas supplier 310 to stop, and the light emitting control unit 530 may control to operate the light source 1200. In a modified exemplary embodiment, the operation controller 500 may compare the detected vacuum pressure with the reference vacuum pressure. When the detected vacuum pressure reaches the reference vacuum pressure, the cover control unit 520 may control the vacuum controller 400 to stop, and the light emitting control unit 530 may control to operate the light source 1200.

Thus, the light rays may be generated from the light emitting unit 1210 and may pass through the transparent support structure 1120 to illuminate the adhesive T. The separated chips C of the dicing substrate W may be detached from the adhesive T and may be formed into the die D.

In an exemplary embodiment, when the photochemical reactions to the adhesive T are not required, the cover structure 1000 is not combined with the body 1100 and may remain in the standby area. The detachment of the chips C from the adhesive T may be conducted at an atmospheric environment.

Thereafter, the die D may be picked up individually from the dicing substrate DS and may be bonded to the circuit board P (operation S700).

When the chip C is detached from the adhesive T and the chip C is formed into the die D, a die transfer unit 19 may pick up the die D and may transfer the die D to the mounting unit 20.

For example, the die transfer unit 19 may pick up the die D by vacuum absorption and may transfer the die D to a die modifier 22 of the mounting unit 20. For example, when the die D includes a flip chip having solder bumps, the die modifier 22 may include a flux coater that coats the die D with flux.

The circuit board P may be transferred to the mounting unit 20 by a board provider 11.

For example, the board provider 11 may include a first magazine 12 in which a plurality of the circuit boards P may be stacked, and a board transfer unit 13 that individually transfers the circuit board P from the first magazine 12 to the mounting unit 20. For example, the board transfer unit 13 may include a conveyer belt extending to the mounting unit 20. Thus, the circuit board P may be provided to the mounting unit 20 from the first magazine 12 via the board transfer unit 13.

For example, the circuit board P may include a printed circuit board (PCB) on which a plurality of die mounting areas may be arranged in a matrix shape. For example, a board detector 14 may be provided over the board transfer unit 13, and each of the mounting areas of the circuit board P may be inspected while the circuit board P is being transferred along the conveyer belt.

The mounting unit 20 may include a board locker 21 to which the circuit board P may be fixed, the die modifier 22 that makes preliminary preparations for the bonding process, and a cross mover 23 that mounts the modified die D onto a corresponding mounting area of the circuit board P.

When the preliminary preparations such as, for example, the flux coating process, are completed on the die D in the die modifier 22, the cross mover 23 may pick up the modified die D from the die modifier 22 and may transfer the die D to a mounting spot over the mounting area of the circuit board P. The cross mover 23 may linearly move in x and y directions perpendicular to each other so as to search the mounting spot, and then may move downwards and locate the modified die D at the mounting area of the circuit board P.

When the modified dies D are located at every mounting area of the circuit board P, the circuit board P having the die D may be transferred to a bonding unit 30 in which the die D may be bonded to the circuit board P. The circuit board P may be transferred to the bonding unit 30 from the mounting unit 20 by a guide rail 31, and then various bonding processes such as, for example, a reflow process, may be performed on the die D. Thus, the die D may be bonded to the circuit board P and a die-bonded circuit board CP may be formed in the bonding unit 30.

When the bonding process is completed in the bonding unit 30, the die-bonded circuit board CP may be transferred to an unloading unit 40. The die-bonded circuit board CP may be removed from the die bonding apparatus 90 by the unloading unit 40. For example, the die-bonded circuit board CP may be stacked from the bonding unit 30 into a second magazine 42 in the unloading unit 40 by a board transfer 41 such as a robot arm.

Accordingly, the photochemical reactions for detaching the chips C from the adhesive may be selectively conducted under the low-oxygen state. As a result, the chip C may be sufficiently detached from the adhesive, and the detach failures of the chips C in the packaging process may be sufficiently prevented or reduced.

According to exemplary embodiments of the present inventive concept, the dicing substrate DS having a plurality of separated chips C may be loaded onto the body 100 of the light source, and the cover structure 1000/1001 may be combined with the body 1100 in such a configuration that the dicing substrate DS is positioned in the closed space CS defined by the cover structure 1000/1001 and the body 1100. Then, the closed space CS may be controlled to be a low-oxygen state or a vacuum state. Thus, the photochemical reaction or the hardening process for detaching the chips C from the adhesive T may occur under a low-oxygen state in the closed space CS. As a result, the separated chips C may be sufficiently detached from the adhesive T.

For example, the operation of the gas supplier 310/the vacuum controller 400 and the operation of the light source may be automatically controlled by the operation controller c/500. As a result, the hardening process under the low-oxygen state may be automatically conducted, and detach failures between the chips C and the adhesive T may be remarkably reduced in the die boding process.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A cover structure, comprising:
   a frame combined with a light structure that emits a light to an object thereon and enclosing the object such that the object is covered by the frame in an inner space of the frame,
   and the inner space is sealed by the combined frame and light structure to provide a closed space between the frame and the light structure;
   a driver that selectively combines the frame and the light structure by moving the frame toward the light structure such that the frame contacts the light structure; and
   an oxygen discharger that creates a low-oxygen state in the closed space by discharging oxygen from the closed space,
   wherein the oxygen discharger comprises a gas exchanger that supplies a substitute gas into the closed space and replaces at least one inner gas of the closed space with the substitute gas.

2. The cover structure of claim 1, wherein the gas exchanger comprises:
   a gas supplier that supplies the substitute gas into the closed space through a plurality of supply openings penetrating through the frame; and
   a gas discharger that discharges a discharge gas from the closed space through a plurality of discharge openings penetrating through the frame,
   wherein the discharge openings are arranged along a first circumference having a first radius from a center of the frame, and the supply openings are arranged along a second circumference having a second radius, different from the first radius, from the center of the frame,
   wherein the substitute gas is different than the discharge gas.

3. The cover structure of claim 2, wherein the gas supplier comprises:
   a reservoir that stores the substitute gas;
   a supply gas transfer component that transfers the substitute gas from the reservoir to the closed space; and
   a flow controller connected to the supply gas transfer component that controls a flow rate of the substitute gas.

4. The cover structure of claim 3, wherein the supply gas transfer component comprises:
   a supply line extending from the reservoir to the supply openings of the frame and through which the substitute gas flows from the reservoir to the closed space; and
   a supply flow guide detachably secured to the supply openings that guides the substitute gas into the closed space.

5. The cover structure of claim 2, wherein the gas discharger comprises:

a discharge gas transfer component that transfers the discharge gas out of the closed space; and a concentration detector that detects an oxygen concentration of the discharge gas.

6. The cover structure of claim 5, wherein the discharge gas transfer component comprises:

a discharge flow guide detachably secured to the discharge openings that guides the discharge gas out of the closed space; and a discharge line connected to the discharge flow guide and through which the discharge gas flows.

7. A light illuminating apparatus, comprising:

a body comprising a housing and a transparent support structure which is transparent to an ultraviolet light, wherein the housing has a three-dimensional shape comprising an open top, and the transparent support structure covers a portion of the housing and supports a dicing substrate in which a plurality of separated chips is attached to one another by an adhesive;

a light structure disposed in the body that emits a light, wherein the chips are detached from the adhesive in response to the emitted light illuminating the dicing substrate; and a cover structure combined with the body and covering the dicing substrate, wherein the cover structure comprises:

a frame combined with the body and enclosing the dicing substrate such that the dicing substrate is covered by the frame in an inner space of the frame, and the inner space is sealed by the combined frame and body to provide a closed space between the frame and body;

a driver that selectively combines the frame and the body by moving the frame toward the body such that the frame contacts the body; and an oxygen discharger that creates a low-oxygen state in the closed space by discharging oxygen from the closed space wherein the driver comprises:

an aligning guide detachably secured to the frame; and a driving shaft coupled to the aligning guide, wherein the driving shaft selectively combines the frame with the body by linearly moving in an upward direction and a downward direction.

8. The light illuminating apparatus of claim 7, wherein the oxygen discharger comprises a gas exchanger that supplies a substitute gas into the closed space and replaces at least one inner gas of the closed space with the substitute gas.

9. The light illuminating apparatus of claim 8, wherein the gas exchanger comprises:

a gas supplier that supplies the substitute gas into the closed space through a plurality of supply openings penetrating through the frame, wherein the gas supplier comprises a flow controller that controls a flow rate of the substitute gas; and a gas discharger that discharges a discharge gas from the closed space through a plurality of discharge openings penetrating through the frame, wherein the gas discharger comprises a concentration detector that detects an oxygen concentration of the discharge gas, wherein the discharge openings are arranged along a first circumference having a first radius from a center of the frame, and the supply openings are arranged along a second circumference having a second radius, different from the first radius, from the center of the frame, wherein the substitute gas is different than the discharge gas.

10. The light illuminating apparatus of claim 9, wherein the substitute gas comprises an inactive gas having an atomic weight greater than the oxygen.

11. The light illuminating apparatus of claim 7, wherein the oxygen discharger comprises a vacuum controller that creates a substantial vacuum state in the closed space by removing at least one inner gas from the closed space.

12. The light illuminating apparatus of claim 11, wherein the vacuum controller comprises:

a vacuum generator that generates a vacuum pressure;

a vacuum transfer component that transfers the vacuum pressure to the closed space through a suction hole penetrating through the frame; and a vacuum sensor that detects an inner vacuum pressure of the closed space.

13. A light illuminating apparatus, comprising:

a frame comprising an inner space shaped and dimensioned to accommodate an object;

a light structure providing a light to the object;

a driver that brings the frame into contact with the light structure by moving the frame toward the light structure, wherein, when the object is disposed on the light structure and is covered by the frame in the inner space, the inner space is sealed in response to the frame coming into contact with the light structure to provide a closed space enclosing the object; and an oxygen discharger that creates a low-oxygen state in the closed space by discharging oxygen from the closed space, wherein the oxygen discharger comprises a gas exchanger that supplies a substitute gas into the closed space and replaces at least one inner gas of the closed space with the substitute gas.

14. The light illuminating apparatus of claim 13, wherein the gas exchanger comprises:

a gas supplier that supplies the substitute gas into the closed space through a plurality of supply openings penetrating through the frame; and a gas discharger that discharges a discharge gas from the closed space through a plurality of discharge openings penetrating through the frame, wherein the discharge openings are arranged along a first circumference having a first radius from a center of the frame, and the supply openings are arranged along a second circumference having a second radius, different from the first radius, from the center of the frame, wherein the substitute gas is different than the discharge gas.

* * * * *